United States Patent
Vellaiyanaicken et al.

(10) Patent No.: US 10,373,892 B2
(45) Date of Patent: Aug. 6, 2019

(54) HIGH CURRENT HIGH POWER SOLID STATE RELAY

(71) Applicants: TE CONNECTIVITY CORPORATION, Berwyn, PA (US); TE CONNECTIVITY INDIA PRIVATE LIMITED, Bangalore, Karnatake (IN)

(72) Inventors: Palanisamy Vellaiyanaicken, Chennai (IN); Robert Steve Felisida Delacruz, Reno, NV (US)

(73) Assignees: TE CONNECTIVITY CORPORATION, Berwyn, PA (US); TE CONNECTIVTY INDIA PRIVATE LIMITED, Bangalore (IN)

(*) Notice: Subject to any disclaimer, the term of this patent is extended or adjusted under 35 U.S.C. 154(b) by 100 days.

(21) Appl. No.: 15/549,608

(22) PCT Filed: Feb. 18, 2015

(86) PCT No.: PCT/IN2015/000093
§ 371 (c)(1),
(2) Date: Aug. 8, 2017

(87) PCT Pub. No.: WO2016/132372
PCT Pub. Date: Aug. 25, 2016

(65) Prior Publication Data
US 2018/0033715 A1  Feb. 1, 2018

(51) Int. Cl.
*H03B 1/00* (2006.01)
*H03K 3/00* (2006.01)
(Continued)

(52) U.S. Cl.
CPC .......... *H01L 23/3675* (2013.01); *H01L 23/50* (2013.01); *H01L 25/072* (2013.01);
(Continued)

(58) Field of Classification Search
CPC ... H01L 23/3675; H01L 23/50; H01L 25/115; H03K 17/08104; H03K 17/122; H02M 1/08; H02M 3/33523
(Continued)

(56) References Cited

U.S. PATENT DOCUMENTS

| | | | |
|---|---|---|---|
| 2004/0235262 A1* | 11/2004 | Lee | H01L 21/76264 438/411 |
| 2006/0261368 A1* | 11/2006 | Fogleman | H01L 25/115 257/107 |
| 2007/0134976 A1* | 6/2007 | Fujimoto | H01L 23/3677 439/495 |

FOREIGN PATENT DOCUMENTS

EP    1 432 030 A2    6/2004

OTHER PUBLICATIONS

International Search Report, Application No. PCT/IN2015/000093, International Filing Date, Feb. 18, 2015.

* cited by examiner

*Primary Examiner* — Metasebia T Retebo

(57) ABSTRACT

A solid state relay includes a source bus and a drain bus. Solid state switches are arranged to switch power from the drain bus to the source bus. A control circuit controls a gate of the solid state switches. Each solid state switch includes a source terminal, a drain terminal and a gate terminal. The source terminals are conductively attached to the source bus and the drain terminals are conductively attached to the drain bus. The gate terminal opens and closes power through the solid state switches. The source bus is electrically isolated from the drain bus when the plurality of solid state switches is controlled by the gate terminal to an open state, the source bus is in electrical communication with the drain bus when the solid state switches is controlled by the gate terminal to a closed state.

18 Claims, 4 Drawing Sheets

(51) Int. Cl.
*H01L 23/367* (2006.01)
*H01L 25/11* (2006.01)
*H03K 17/12* (2006.01)
*H01L 23/50* (2006.01)
*H03K 17/081* (2006.01)
*H01L 25/07* (2006.01)
*H02M 1/08* (2006.01)
*H02M 3/335* (2006.01)

(52) U.S. Cl.
CPC ...... *H01L 25/115* (2013.01); *H03K 17/08104* (2013.01); *H03K 17/122* (2013.01); *H02M 1/08* (2013.01); *H02M 3/33523* (2013.01)

(58) Field of Classification Search
USPC .......................................................... 327/109
See application file for complete search history.

HIGH CURRENT HIGH POWER SOLID STATE RELAY

BACKGROUND

The application generally relates to a high current high power solid state relay. The application relates more specifically to a high current high power solid state relay in a planar metal bus bar and heat dissipating enclosure.

Solid state relays (SSRs) may be based on a single MOSFET or multiple MOSFETs in a paralleled array. SSRs are generally limited in the amount of current, or the ampacity, that the device is capable of switching. Another limitation of SSRs is the lack of electrical isolation between the SSR actuating or gate circuits and the load circuits. However SSRs have an advantage over traditional mechanical relays as traditional relays have slower turn-on and turn-off times.

A MOSFET switch is a three terminal device including source, gate and drain terminals. SSRs in the past were limited by internal resistance present in the MOSFETs between the drain and the source when the device is gated on. Recent technology has reduced the dependency of the devices on the resistance from source to drain, but other physical limitations in the SSR package are still a concern. The relay package resistance due to the leadframe, wire bonds, etc., may limit the performance of the SSR. In high conductivity devices, the external resistances may offset improvements in the MOSFET, as the internal resistance between the drain and the source tends to increase significantly when the temperature of the SSR increases due to high currents. Other solid state devices may also be used to switch current in an SSR, such as SCRs or triacs.

To dissipate temperature increase in the MOSFET, large heat sinks are used for mounting the SSR to dissipate heat produced by the resistance and current. In some instances the heat sinks may permit the MOSFETs to become overheated due to temperature rise in the MOSFET, which can destroy the MOSFETs if the maximum temperature rating is exceeded. One solution is to attempt to lower the resistance between the MOSFET, the source and the load by increasing package component parameters, e.g., connector size, trace width and thickness, and wire gauge, while decreasing other package component parameters, e.g., trace lengths, wire lengths, and connector resistance, within the design parameters of the heat sink.

Intended advantages of the disclosed systems and/or methods satisfy one or more of these needs or provide other advantageous features. Other features and advantages will be made apparent from the present specification. The teachings disclosed extend to those embodiments that fall within the scope of the claims, regardless of whether they accomplish one or more of the aforementioned needs.

SUMMARY

One embodiment discloses a solid state relay including a source bus and a drain bus. A plurality of solid state switches is arranged to switch power from the drain bus to the source bus. A control circuit controls a gate terminal of the plurality of solid state switches. Each solid state switch of the plurality of solid state switches includes a source terminal, a drain terminal and a gate terminal. The source terminals are conductively attached to the source bus and the drain terminals are conductively attached to the drain bus. The gate bus is in electrical communication with the control circuit. The gate terminal is operable to open and close a power flow through the plurality of solid state switches in response to a signal from the control circuit. The source bus is electrically isolated from the drain bus when the plurality of solid state switches is controlled by the gate terminal to an open state; the source bus is in electrical communication with the drain bus when the plurality of solid state switches is controlled by the gate terminal to a closed state; and the source bus and the drain bus are co-planar.

In another embodiment, a solid state relay (SSR) package includes a cover portion and a bottom case portion defining a hollow interior for receiving a solid state relay. The cover portion and the bottom case portion are in thermal communication with the solid state relay and arranged to dissipate heat generated by the operation of the solid state relay. The solid state relay includes a source bus and a drain bus. A plurality of solid state switches is arranged to switch power from the drain bus to the source bus. A control circuit controls a gate terminal of the plurality of solid state switches. Each solid state switch of the plurality of solid state switches includes a source terminal, a drain terminal and a gate terminal. The source terminals are conductively attached to the source bus and the drain terminals are conductively attached to the drain bus. The gate bus is in electrical communication with the control circuit. The gate terminal is operable to open and close a power flow through the plurality of solid state switches in response to a signal from the control circuit. The source bus is electrically isolated from the drain bus when the plurality of solid state switches is controlled by the gate terminal to an open state, the source bus is in electrical communication with the drain bus when the plurality of solid state switches is controlled by the gate terminal to a closed state; and the source bus and the drain bus are co-planar.

In still another embodiment, a solid state relay includes a source bus and a drain bus. A plurality of solid state switches are arranged to switch power from the drain bus to the source bus. A control circuit is provided to control a gate terminal of the plurality of solid state switches. Each solid state switch of the plurality of solid state switches includes a source terminal, a drain terminal and a gate terminal. The source terminals are conductively attached to the source bus and the drain terminals are conductively attached to the drain bus. The gate bus is in electrical communication with the control circuit. The gate terminal is operable to open and close a power flow through the plurality of solid state switches in response to a signal from the control circuit. The source bus is electrically isolated from the drain bus when the plurality of solid state switches is controlled by the gate terminal to an open state.

Certain advantages of the embodiments described herein include increased current capacity of solid state relays and effective isolation between the actuating circuits and the load circuits. This isolation is due to the implementation of Flyback converter (or DC-to-DC converter) circuit in the control circuit. Further advantages of the disclosed embodiments are reduced turn-on/turn-off times and a low profile package.

Alternative exemplary embodiments relate to other features and combinations of features as may be generally recited in the claims.

DETAILED DESCRIPTION OF THE EXEMPLARY EMBODIMENTS

Figure 1:
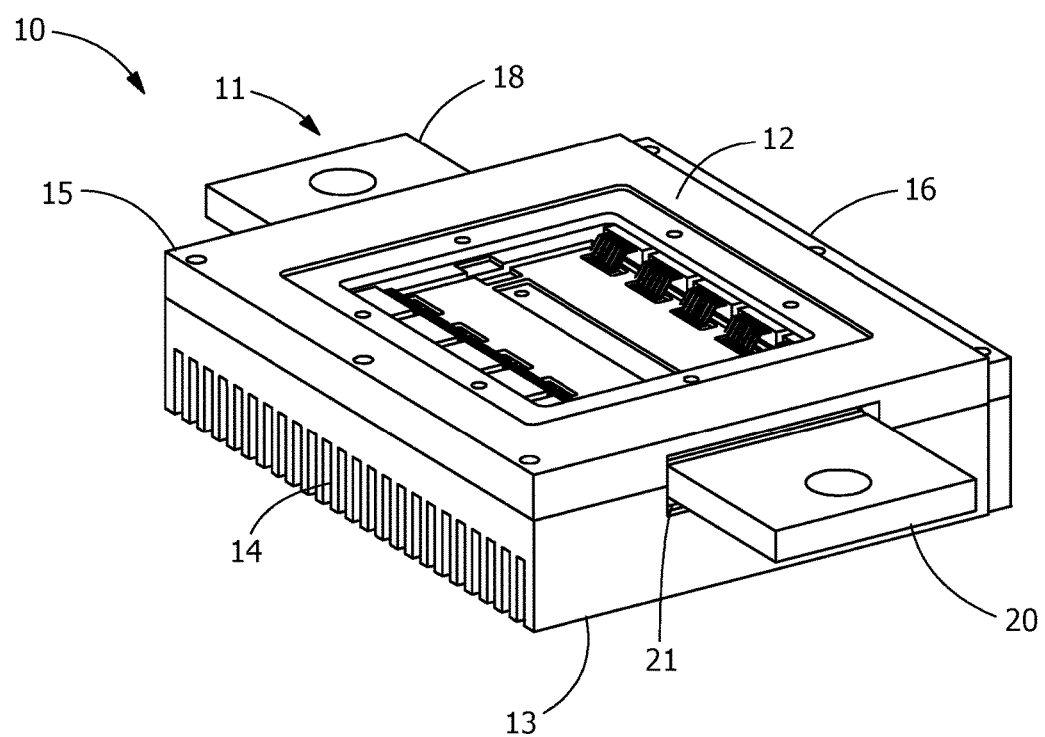
FIG. 1 is an isometric view of an exemplary SSR package with a planar metal bus bar in a metal enclosure.
Figure 2:
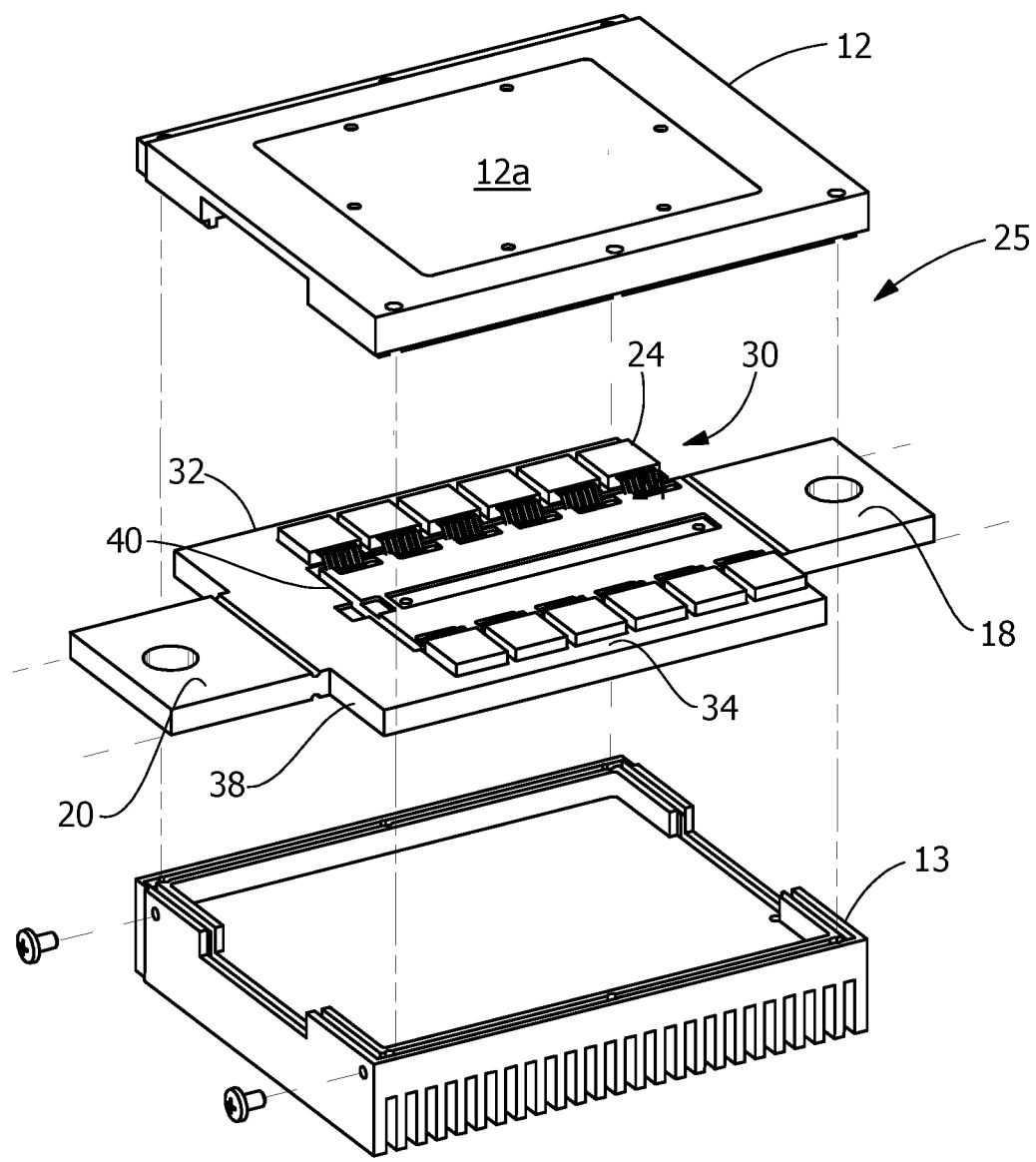
FIG. 2 an exploded view of an exemplary drain bus arrangement.

FIG. 1 shows an isometric view of an SSR package 10 with a planar metal bus bar 11 in a metal enclosure 15. SSR package 10 includes a cover 12 and a case bottom 13 defining a hollow interior for receiving an SSR 25 (FIG. 2). Cover 12 includes a removable lid 12a (FIG. 2). Case bottom 13 preferably includes fins 14 to increase heat dissipation from SSR package 10. Multiple fins 14 traverse the exterior surface of case bottom 13. In one embodiment fins 14 may be about 2.54 mm thick and separated by a gap of about 2.03 mm to 2.11 mm. Bus bar 11 includes a source bus 18 and a drain bus 20 at the output and input, respectively. Drain bus 20 conducts the supply electrical current to the input of SSR 25 and source bus 18 conducts the load electrical current from the output of SSR 25. A controller board 16 is attached to one side of metal enclosure 15. In one embodiment controller board 16 may be enclosed by aluminum or similar heat-conductive metals to extend the heatsink enclosure 15. Enclosure 15 may also be constructed of aluminum or similar heat-conductive metals. Busbar 11 extends into and from enclosure 15 through apertures 21. Busbar 11 is electrically isolated from contact with enclosure 15, e.g., via air gap around aperture 21, or dielectric spacers, or potting compounds, such as, thermal epoxies and the like (not shown).

Figure 5:
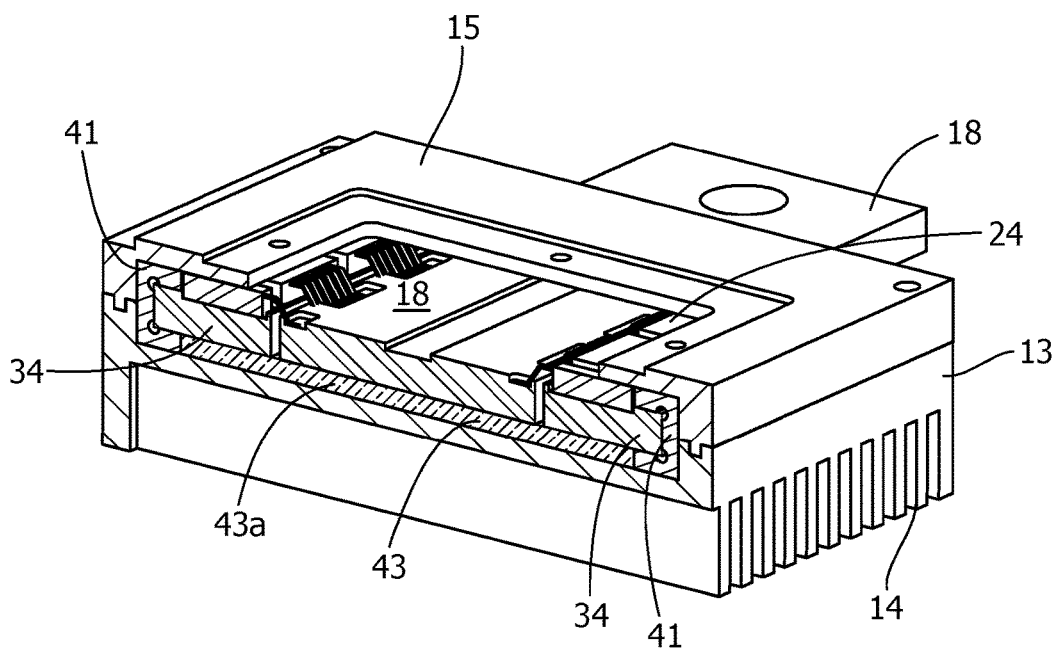
FIG. 5 is a cross-sectional isometric view of the SSR package of FIG. 1.

Referring next to FIG. 2, an SSR 25 is shown having a plurality of switch elements, or MOSFETs 24. Each MOSFET 24 includes a source terminal 26 which is electrically connected directly to source bus 18, e.g., via solder or spot weld, or, electrically-conductive epoxy or compound. A drain terminal 28 of each MOSFET is connected to drain bus 20. In the embodiment of FIG. 2, SSR 25 is arranged with two rows 30 of six MOSFETs 24, and drain bus 20 has a pair of side bus members including a left drain bus member 32 and a right drain bus member 34. Drain bus members 32, 34 extend parallel to the left and right sides, respectively, of source bus 25 and are substantially coplanar with source bus 25 and drain bus 20. Drain bus members 32, 34 are connected with drain bus 20 main member 36 via cross member 38. Drain bus members 32, 34, 36 and 38 are all components of drain bus 20. Drain bus 20 may be unitary construction, e.g., cast, forged or machined, or multi-piece assembly in discrete sections. Drain bus 20 and source bus 18 are electrically isolated via air gap 40. Air gap 40 is maintained by the attachments of MOSFETs 24 between source bus 18 and left and right drain bus members 32, 34. MOSFETs 24 connect source bus 18 and drain bus 20 and are disposed on the output, or source terminal side adjacent source bus 18, and on the input or drain terminal side adjacent drain bus 20. The positioning of MOSFETs 24 adjacent both source and drain buses allows SSR to be a single layer with components such as MOSFETs 24 and buses 18, 20 exposed on either side to heat dissipation surfaces of SSR package 10 for improved heat dissipation and performance. In one embodiment the array of MOSFETs 24 have a total resistance no greater than 300 micro-ohm. In one embodiment the top surface of MOSFETs 24 may be in direct contact with the heat sink cover 15. The bottom of the bus members 32, 34 and the outer side of the drain bus 20 may have about 0.050" gap 43 separating drain bus 20 from the heat sink case bottom 13. Gap 43 may be maintained by clips 41 placed around the bus bar assembly drain bus members 32, 34 and by thermal epoxy 43a which may coat the entire bus bar assembly, as shown in FIG. 5. While the disclosed embodiment refers to MOSFETs 24 as the solid state switches it is understood that other solid state switches, e.g., Bipolar Junction Transistors (BJTs), Insulated-Gate Bipolar Transistors (IGBTs), SCRs or triacs may be used in place of MOSFETs.

Figure 3:
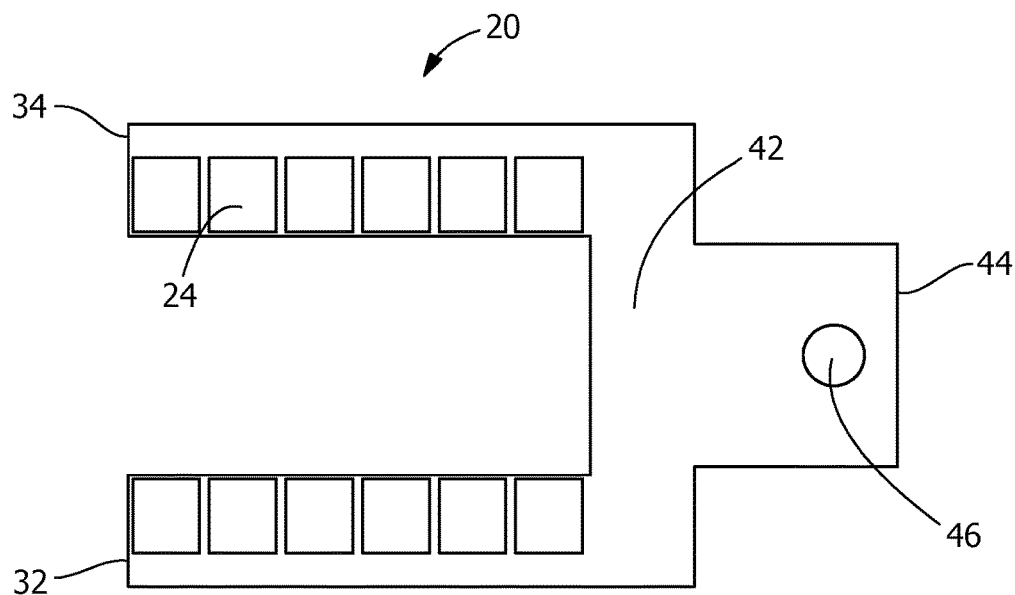
FIG. 3 shows an isometric view of an exemplary SSR for use in the SSR package of FIG. 1.

Referring to FIG. 3, an exemplary drain bus arrangement is shown. Drain bus 20 includes left and right drain bus members 32, 34, a crossover member 42, and a drain bus connection member 44. Drain bus member 20 maintains substantially symmetrical current flow through drain bus 20. Connection member 44 provides a connection bus including an optional eyelet 46 for external cable or conductors to attach to SSR package 10.

It should be noted that more or less MOSFETs 24 may be arranged in each row 30 as required to achieve the desired ampacity of the SSR 25. Preferably the rows 30 on either side of SSR 25 are symmetrical for balanced distribution of current.

In operation, controller board 16 controls signals to gate terminals (not shown) on MOSFETs 24 for controlling the switching of current between source terminals 26 to drain terminals 28. As discussed above, MOSFETs 24 may be connected in parallel between source conductor 18 and drain conductor 20. Gate terminals (not shown) for each MOSFET 24 are electrically connected together, and control MOSFETs to switch current from drain bus 20 to source bus 18 in the closed state and to block current flow from drain bus 20 to source bus 18 in the open state.

Figure 4:
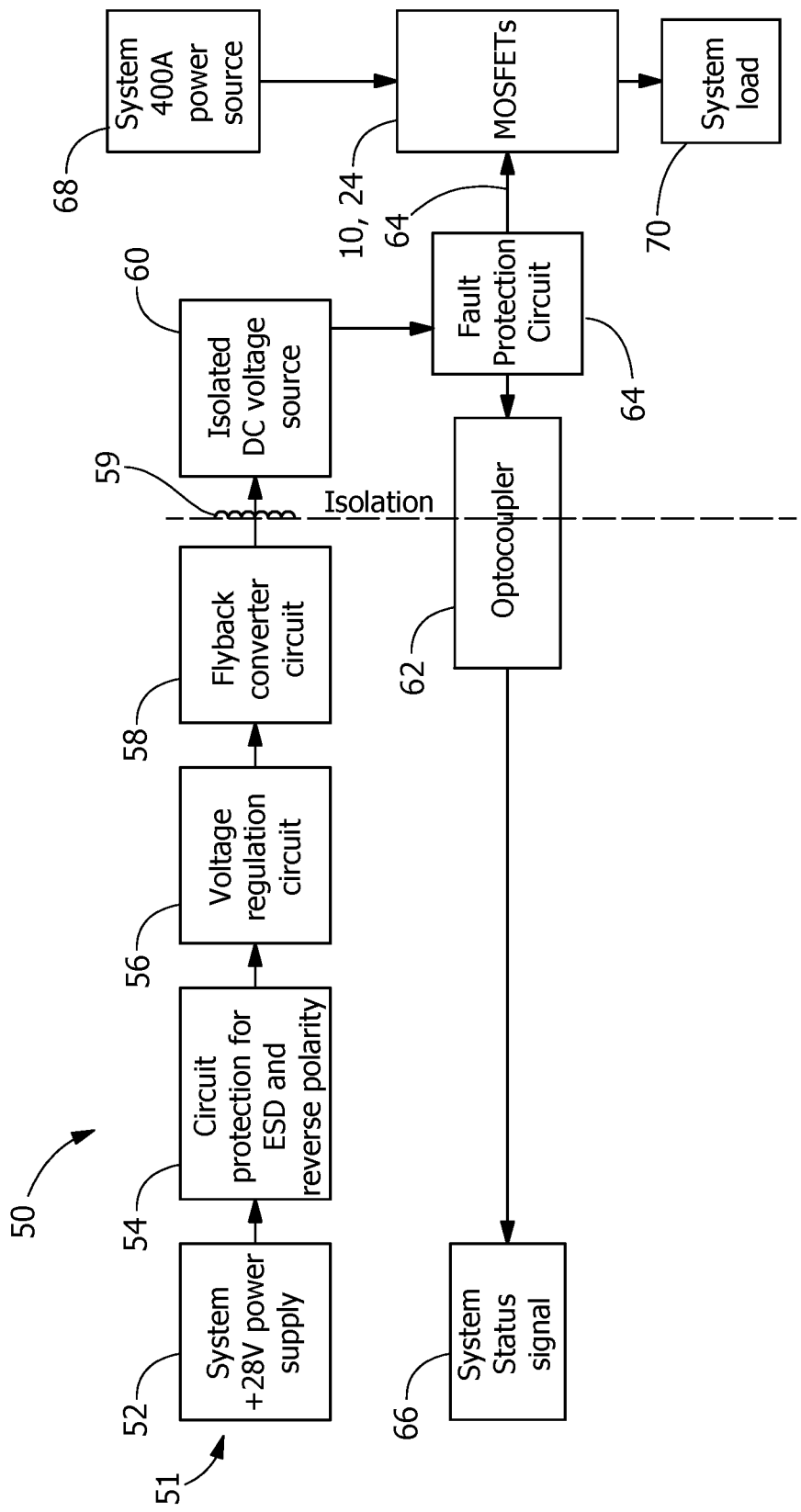
FIG. 4 shows a flow diagram of an exemplary control circuit for gating signals to MOSFETs in the SSR package.

Referring next to FIG. 4 a flow diagram 50 illustrates an exemplary control circuit for gating signals to MOSFETs in the SSR package. In a control power path 51 a system power supply 52 provides an input power source for the control circuit 50. In one embodiment control power supply 52 may provide a 28 VDC nominal supply voltage. Control power is input to a circuit protection element 54. Circuit protection element 54 provides circuit protection for electrostatic discharge (ESD) and reverse polarity, lightning and Electromagnetic Interference (EMI). At the output of circuit element 54 voltage is regulated by a voltage regulation circuit 56. At the output of voltage regulation circuit 56 a flyback converter circuit 58, together with a flyback transformer 59 provides electrical isolation between the control power path 51 to an isolated DC voltage source 60 for powering an optocoupler device 62. A fault protection circuit 63 is connected between DC voltage source 63, optocoupler device 62 and MOSFETs 24. Optocoupler device 62 provides a gate signal 64 to control switching of MOSFETs 24 assembled in SSR package 10. A system ON/OFF signal 66 from an external control source (not shown) triggers optocoupler 62 for generating gate signal 64. SSR package 10 receives input power from a power source 68 and controls current flow to an external load 70 in response to gate signal 64.

SSR 25 may be capable of switching, rectifying or blocking high current in the range of 1 to 2880 amperes per SSR package 10, In one embodiment the SSR package fault protection circuit will begin a countdown-to-trip at 420 A DC. Highly efficient switching by SSR 25 yields insignificant heat accumulation. Any heat that is built up is rapidly conducted away from MOSFETs 24 via metal surfaces of enclosure 15, including heat fins 14.

It should be understood that the application is not limited to the details or methodology set forth in the following description or illustrated in the figures. It should also be understood that the phraseology and terminology employed herein is for the purpose of description only and should not be regarded as limiting.

It is important to note that the construction and arrangement of the high current, high power SSR, as shown in the various exemplary embodiments is illustrative only. Although only a few embodiments have been described in detail in this disclosure, those who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited in the claims. For example, elements shown as integrally formed may be constructed of multiple parts or elements, the position of elements may be reversed or otherwise varied, and the nature or number of discrete elements or positions may be altered or varied. Accordingly, all such modifications are intended to be included within the scope of the present application. The order or sequence of any process or method steps may be varied or re-sequenced according to alternative embodiments. In the claims, any means-plus-function clause is intended to cover the structures described herein as performing the recited function and not only structural equivalents but also equivalent structures. Other substitutions, modifications, changes and omissions may be made in the design, operating conditions and arrangement of the exemplary embodiments without departing from the scope of the present application.

The invention claimed is:

1. A solid state relay comprising:
   a source bus and a drain bus; a plurality of solid state switches arranged to switch power from the drain bus to the source bus; and a control circuit for controlling a gate terminal of the plurality of solid state switches;
   each solid state switch of the plurality of solid state switches comprising a source terminal, a drain terminal and a gate terminal, the plurality of solid state switches arranged in two rows;
   wherein the source terminals are conductively attached to the source bus and the drain terminals are conductively attached to the drain bus; and the gate bus in electrical communication with the control circuit;
   the drain bus having a pair of side bus drain members including a left drain bus member and a right drain bus member, the side bus drain members extend parallel to left and right sides of source bus and are coplanar with the source bus, the side bus drain members connected with a drain bus connector member by a crossover member;
   the source bus and the drain bus are positioned in a single layer;
   the gate terminal operable to open and close a power flow through the plurality of solid state switches in response to a signal from the control circuit;
   the source bus electrically isolated from the drain bus when the plurality of solid state switches is controlled by the gate terminal to an open state;
   the source bus in electrical communication with the drain bus when the plurality of solid state switches is controlled by the gate terminal to a closed state.

2. The solid state relay of claim 1, wherein the drain bus is connected to an electrical power source and configured to supply electrical current to an input of the plurality of solid state switches.

3. The solid state relay of claim 1, wherein the source bus is connected at the output of the plurality of solid state switches and to a load to supply electrical current from the plurality of solid state switches.

4. The solid state relay of claim 1, wherein each solid state switch of the plurality of solid state switches comprises a MOSFET.

5. The solid state relay of claim 1, each of the side bus drain members connected to the source bus by an equal number of the plurality of solid state switches; the solid state switches fixedly attached to the respective source bus and side bus drain member.

6. The solid state relay of claim 5, wherein the drain bus connector member configured to connect the drain bus to an external conductor connected to an electrical supply source.

7. The solid state relay of claim 6, wherein the side bus drain members of the drain bus and the source bus are electrically isolated via an air gap, the air gap maintained by attachment of the solid state switches connected between the source bus and the pair of side bus drain members.

8. The solid state relay of claim 1, wherein the plurality of solid state switches adjacent the source and the drain bus being configured in the single layer, the plurality of solid state switches, the source and the drain bus exposed directly to a heat dissipation surface of a solid state relay package for heat dissipation and increased current carrying capacity.

9. The solid state relay of claim 1, further comprising a plurality of fins traversing an exterior surface of the solid state relay, the plurality of fins adapted to dissipate heat from the solid state relay.

10. A solid state relay (SSR) package comprising: a cover portion and a bottom case portion defining a hollow interior for receiving a solid state relay; the cover portion and the bottom case portion in thermal conductive contact with the solid state relay and configured to dissipate heat generated in an operation of the solid state relay; the solid state relay comprising: a source bus and a drain bus; a plurality of solid state switches arranged to switch power to the source bus from the drain bus; and a control circuit for controlling a gate terminal of the plurality of solid state switches; each solid state switch of the plurality of solid state switches comprising a source terminal, a drain terminal and a gate terminal, the plurality of solid state switches arranged in two rows; wherein all of the source terminals are conductively attached to the source bus and all of the drain terminals conductively attached to the drain bus; and the gate bus in electrical communication with the control circuit; the drain bus having a pair of side bus drain members including a left drain bus member and a right drain bus member, the side bus drain members extend parallel to left and right sides of source bus and are coplanar with the source bus, the side bus drain members connected with a drain bus connector member by a crossover member; the source bus and the drain bus are positioned in a single layer; the gate terminal operable to open and close a power flow through the plurality of solid state switches in response to a signal from the control circuit; and the source bus electrically isolated from the drain bus when the plurality of solid state switches is controlled by the gate terminal to an open state; the source bus in electrical communication with the drain bus when the plurality of solid state switches is controlled by the gate terminal to a closed state.

11. The SSR package of claim 10, wherein the control circuit comprises a controller board attached to one side of the case portion.

12. The SSR package of claim 10, wherein the drain bus is connected at the input of the plurality of solid state switches and to an electrical supply source.

13. The SSR package of claim 10, wherein each solid state switch of the plurality of solid state switches comprises a MOSFET.

14. The SSR package of claim 10, wherein each of the side bus drain members connected to the source bus by a half of the plurality of solid state switches; the solid state switches fixedly attached to the respective source bus and side bus drain member.

15. The SSR package of claim 10, wherein the drain bus connector member configured to connect the drain bus to an external conductor connected to an electrical supply source.

16. The SSR package of claim 10, wherein the side bus drain members of the drain bus and the source bus are electrically isolated via an air gap, the air gap maintained by attachment of the solid state switches connected between the source bus and the pair of side bus members.

17. The SSR package of claim 10, wherein the plurality of solid state switches adjacent the source and the drain bus being configured in the single layer, the plurality of solid state switches, the source and the drain bus exposed directly to a heat dissipation surface of the SSR package for heat dissipation and increased current carrying capacity.

18. The SSR package of claim 10, wherein the case bottom comprises a plurality of fins traversing an exterior surface of the case bottom, the plurality of configured to dissipate heat from SSR package.

\* \* \* \* \*